(12) United States Patent
Chow

(10) Patent No.: US 6,876,081 B2
(45) Date of Patent: Apr. 5, 2005

(54) COMPOSITE DIELECTRIC LAYERS

(75) Inventor: Loren A. Chow, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/659,068

(22) Filed: Sep. 8, 2003

(65) Prior Publication Data

US 2004/0046259 A1 Mar. 11, 2004

Related U.S. Application Data

(63) Continuation of application No. 10/215,130, filed on Aug. 8, 2002, now Pat. No. 6,674,146.

(51) Int. Cl.⁷ .............................................. H01L 23/48
(52) U.S. Cl. ...................... 257/758; 257/210; 257/211; 257/759; 257/760
(58) Field of Search .......................... 257/66, 190, 210, 257/211, 758, 759, 760

(56) References Cited

U.S. PATENT DOCUMENTS

| | | | | |
|---|---|---|---|---|
| 5,081,053 A | * | 1/1992 | Heremans et al. | 438/151 |
| 6,726,996 B2 | * | 4/2004 | Barth et al. | 428/446 |
| 2002/0000556 A1 | * | 1/2002 | Sakamoto et al. | 257/66 |
| 2002/0003238 A1 | * | 1/2002 | Ramdani et al. | 257/190 |

* cited by examiner

*Primary Examiner*—David Nelms
*Assistant Examiner*—Andy Huynh
(74) *Attorney, Agent, or Firm*—Blakely, Sokoloff, Taylor & Zafman LLP

(57) ABSTRACT

An apparatus including a contact point formed on a device layer of a circuit substrate or interconnect layer on a substrate; a first dielectric layer including cubic boron nitride on the substrate; and a different second dielectric layer on the substrate and separated from the device layer by the first dielectric layer. Also, an apparatus including a circuit substrate including a device layer and a composite dielectric layer. The composite dielectric includes a first dielectric material including cubic boron nitride and a different second dielectric material. The first dielectric material surrounds the second dielectric material.

10 Claims, 3 Drawing Sheets

COMPOSITE DIELECTRIC LAYERS

CROSS-REFERENCE TO RELATED APPLICATION

This application is a continuation of U.S. patent application Ser. No. 10/215,130, filed Aug. 8, 2002 now U.S. Pat. No. 6,674,146.

BACKGROUND

1. Field

Integrated circuit processing and, more particularly, to the patterning of interconnections on an integrated circuit.

2. Background

Modern integrated circuits use conductive interconnections to connect the individual devices on a chip or to send or receive signals external to the chip. Popular types of interconnection include aluminum alloy interconnections and copper interconnections.

One process used to form interconnections, particularly copper interconnections, is a damascene process. In a damascene process, a trench is cut in a dielectric and filled with copper to form the interconnection. A via may be in the dielectric beneath the trench with a conductive material in the via to couple the interconnection to underlying integrated circuit devices or underlying interconnections. In one damascene process (a "dual damascene process"), the trench and via are each filled with copper material by, for example, a single deposition.

A photoresist is typically used over the dielectric to pattern a via or a trench or both in the dielectric for the interconnection. After patterning, the photoresist is removed. The photoresist is typically removed by an oxygen plasma (oxygen ashing). The oxygen used in the oxygen ashing can react with an underlying copper interconnection and oxidize the interconnection. Accordingly, damascene processes typically employ a barrier layer of silicon nitride $Si_3N_4$ directly over the copper interconnection to protect the copper from oxidation during oxygen ashing in the formation of a subsequent level interconnection. In intelayer interconnection levels (e.g., beyond a first level over a device substrate), the barrier layer also protects against misguided or unlanded vias extending to an underlying dielectric layer or level.

In general, the $Si_3N_4$ barrier layer is very thin, for example, roughly 10 percent of the thickness of the pre-metal dielectric (PMD) layer or interlayer dielectric (ILD) layer. A thin barrier layer is preferred primarily because $Si_3N_4$ has a relatively high dielectric constant (k) on the order of 6–7. The dielectric constant of a dielectric material, such as an interlayer dielectric, generally describes the parasitic capacitance of the material. As the parasitic capacitance is reduced, the cross-talk (e.g., a characterization of the electric field between adjacent interconnections) is reduced, as is the resistance-capacitance (RC) time delay and power consumption. Thus, the effective dielectric constant ($k_{eff}$) of a PMD layer or ILD layer is defined by the thin barrier layer and another dielectric material having a lower dielectric constant so that the effect of the high dielectric material typically used for the barrier layer (e.g., $Si_3N_4$) is minimized. Representative dielectric materials for use in combination with a barrier layer to form PMD or ILD layers include silicon dioxide ($SiO_2$), fluorinated silicate glass (FSG), and carbon-doped oxide (CDO).

As technologies advance, the distance (e.g., pitch) between interconnections decreases as more devices and more interconnections (e.g., interconnect lines) are formed on a structure. Thus, the effective dielectric constant ($k_{eff}$) of a PMD or ILD layer is significant.

DETAILED DESCRIPTION

Figure 1:
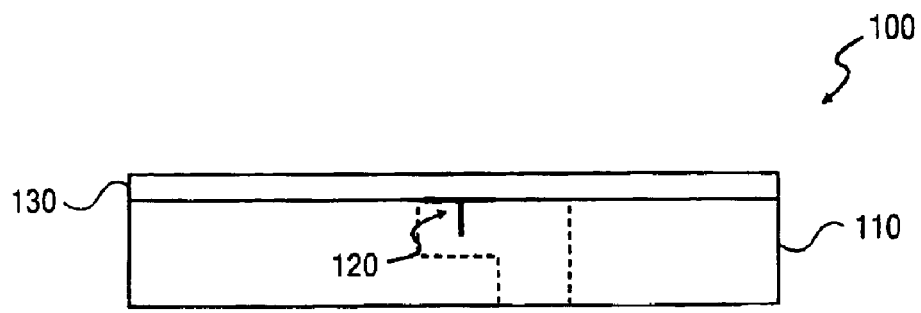
FIG. 1 is a schematic side view of a portion of a circuit substrate or interconnect layer on a substrate including a contact point and a barrier layer formed over the contact point.
Figure 2:
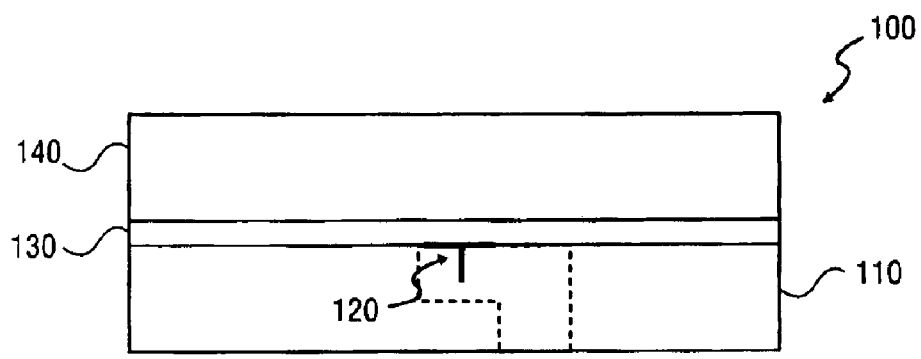
FIG. 2 shows the structure of FIG. 1 following the formation of a dielectric layer on the barrier layer.
Figure 3:
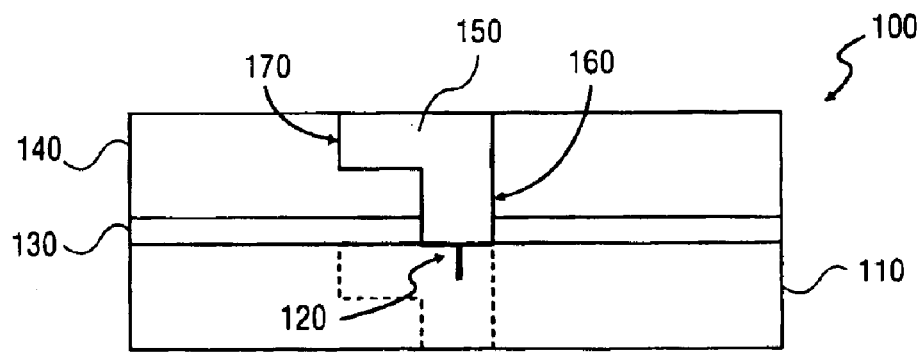
FIG. 3 shows the structure of FIG. 2 following the formation of an interconnection to the contact point.

FIGS. 1–3 illustrate a dual damascene process for forming an interconnection over a contact point. A contact point is, for example, a device on a substrate (e.g., gate, junction, etc.). Alternatively, in a multi-level interconnection device configuration, the contact point also includes an underlying interconnection (e.g., an interconnection line). A typical integrated circuit of a microprocessor may have, for example, five or more interconnection layers or lines stacked on one another, each insulated from one another by dielectric material.

FIG. 1 illustrates a cross-sectional, schematic side view of a portion of a circuit substrate structure. Structure 100 includes substrate 110 of, for example, a semiconductor material such as silicon or a semiconductor layer on an insulator such as glass. Substrate 110 includes contact point 120 on a surface thereof. In one embodiment, contact point 120 is a portion of an underlying interconnect line (e.g., a metal trench). A representative interconnect line is shown in dashed lines. Overlying contact point 120 and substrate 110, in one embodiment, is barrier layer 130. Barrier layer 130 is selected, in one embodiment, to be a material having a dielectric constant (k) less than on the order of about five. In the context of a contact point that is a copper interconnection (e.g., interconnection line), barrier layer 130 is selected to have relatively good copper diffusion characteristics (i.e., to inhibit copper diffusion). Barrier layer 130 is also selected such that it is a material that has an etch characteristic such that it may be selectively etched or retained during an etch operation involving barrier layer 130 or a subsequently introduced dielectric material, such as a dielectric material that, together with barrier material 130, will serve as a pre-metal dielectric (PMD) or interlayer dielectric (ILD) layer dielectric material. One material for barrier layer 130 is cubic boron nitride (CBN). Cubic boron nitride has a dielectric constant on the order of 4–4.5. Cubic boron nitride may be introduced by chemical vapor deposition (CVD) and tends to serve as an inhibitor of copper diffusion when used as the barrier material in the context of copper. Further, cubic boron nitride is selectively etchable in, for example, a fluorine plasma. Still further, cubic boron nitride is a relatively high compressive stress material allowing, in one example, its use in conjunction with high tensile stress materials to minimize the effect of the tensile stress.

In one embodiment, barrier layer 130 of cubic boron nitride is introduced, according to current technologies, to a thickness on the order of 40 nanometers (nm) to 100 nm. The thickness is selected, in one example, to be sufficient to protect an underlying contact point 120 (e.g., copper interconnection line), but not to unacceptably increase the capacitance between contact point 120 and, for example, an overlying or adjacent interconnection (e.g., thickness selected to minimize the contribution of barrier layer 130 to $k_{eff}$).

Overlying barrier layer 130 in the illustration shown in FIG. 2 is dielectric layer 140. Dielectric layer 140 is, for example, a tetraethyl orthosilicate (TEOS), a plasma enhanced CVD (PECVD), $SiO_2$, a fluorinated silicate glass (FSG), or a carbon-doped oxide (CDO) deposited to a thickness on the order of approximately 700 nanometers according to current technologies. As described in more detail with reference to FIGS. 4–9 and the accompanying text, dielectric layer 140 may also be an aerogel. The thickness of dielectric layer 140 will depend, in part, on size characteristics and scaling considerations for the device. Collectively, barrier layer 130 and dielectric layer 140 define a composite dielectric layer (e.g., PMD or ILD layer) having a composite or an effective dielectric constant ($k_{eff}$). In one embodiment, the contribution of the material selected for barrier layer 130 is less than 20 percent, in another embodiment, less than 10 percent of the $k_{eff}$. Once dielectric layer 140 is deposited and formed, the material may be planarized, for example, with a polish (e.g., chemical-mechanical polish).

Referring to FIG. 3, following the introduction of dielectric layer 140, an opening is made to contact point 120. In one embodiment, the opening includes via 160 and trench 170 formed, for example, by sequential photolithographic patterning and etching operations. Representatively, what is shown is a dual damascene process where via 160 and trench 170 are formed as the opening and are filled with conductive material 150 such as a copper material and the conductive material in trench 170 serves as an interconnection line. Thus, although not shown in the cross sectional view of FIG. 3, trench 170 may extend into the page as viewed to act as a trench for a conductive material interconnection line to reside therein. In addition to conductive material of, for example, a copper material in via 160 and trench 170, one or more layers may be deposited along the sidewalls of via 160 and trench 170 to, for example, inhibit diffusion of the conductive material and/or improve adhesion of the conductive material.

Via 160 opening is made through dielectric layer 140 and barrier material 130. To form an opening through dielectric layer 140, a suitable etchant is selected that does not substantially react or disrupt underlying barrier material 130. In the case of a dielectric layer 140 of FSG and barrier layer 130 of cubic boron nitride, a suitable etchant to etch FSG is, for example, a $SiCl_4$ etch chemistry. With such an etchant, an etch of dielectric layer 140 will proceed through the material and substantially stop when barrier material 130 is exposed. A subsequent etch chemistry, such as a fluorine-based etch chemistry (e.g., HF, $CF_4$) can then be used to form an opening through barrier material 130 and expose contact point 120.

After exposing contact point 120, conductive material 150 is deposited in trench 170 and via 160. A suitable conductive material is, for example, a copper material deposited by a damascene process. Once conductive material 150 is deposited in trench 170 and via 160, the substrate may be planarized. The process described above may then be repeated for a subsequent interconnection layer or layers.

Figure 4:
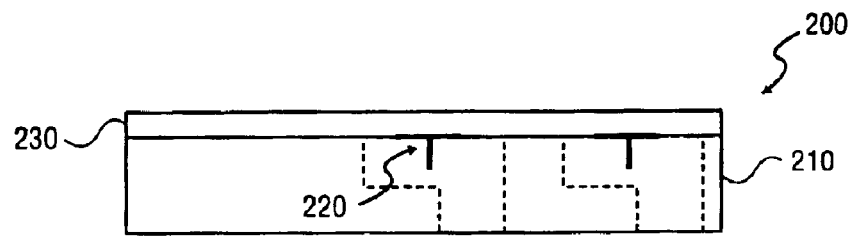
FIG. 4 is a schematic side view of a portion of a circuit substrate showing a contact point and a barrier layer overlying the contact point.

FIGS. 4–9 describe a second embodiment. Referring to FIG. 4, structure 200 in this embodiment includes substrate 210 having a contact point 220 on a surface thereof. Contact point may be, for example, a device or an interconnection formed over a substrate to one or more devices formed on or near the substrate.

Overlying contact point 220 (as viewed) on a surface of substrate 210 in the structure of FIG. 4 is barrier layer 230. Barrier layer 230 may be deposited, representatively, as a blanket over a portion, including the entire portion of the surface of substrate 210. Barrier layer 230 is selected to be a material having a dielectric constant (k) less than 5. In another embodiment, barrier layer 230 is a material selected to have good copper diffusion characteristics and etch selectivity. Cubic boron nitride is one material that has such characteristics. Barrier layer 230 of cubic boron nitride, in one example, has a thickness on the order 40 nm to 100 nm.

Figure 5:
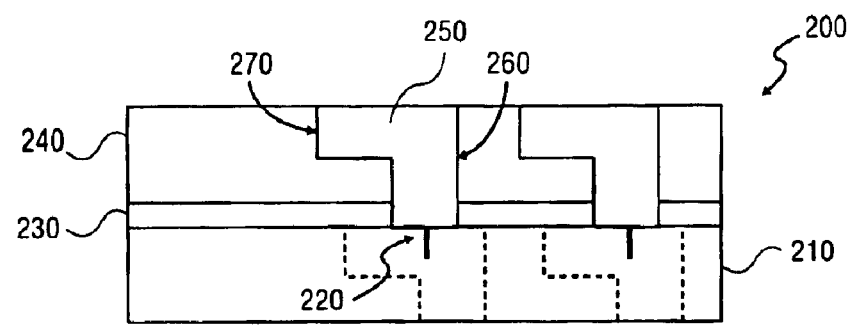
FIG. 5 shows the structure of FIG. 4 following the introduction of a sacrificial layer and the formation of an interconnection to the contact point.

FIG. 5 shows the structure of FIG. 4, following the introduction of sacrificial layer 240 and the formation of trench 270, via 260 and conductive material 250 within the trench and via. Sacrificial layer 240 may be, for example, a dielectric material such as $SiO_2$ or other material that may be patterned to the exclusion of barrier material 230. Sacrificial layer 240 is deposited to a thickness sufficient (perhaps after planarization) to accommodate a properly sized interconnection line (in trench 270) and contact (in via 260). One suitable thickness for sacrificial layer 240 according to current techniques is on the order of about 700 nanometers. As shown in FIG. 5, conductive material 250 of, for example, copper material is formed in trench 270 and via 260 and contacts contact point 220.

Figure 6:
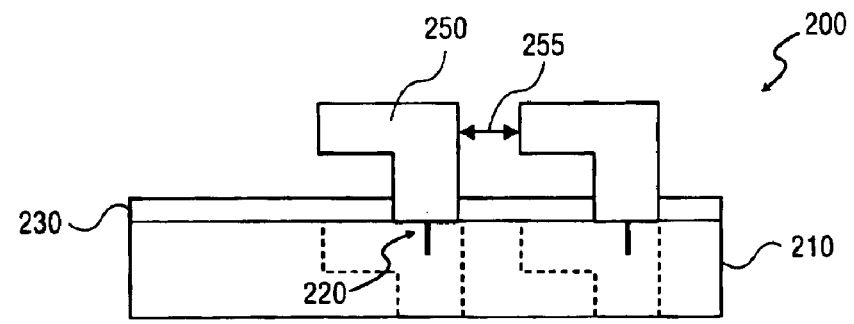
FIG. 6 shows the structure of FIG. 5 following the removal of the sacrificial layer.

FIG. 6 shows the structure of FIG. 5 following the removal of sacrificial material 240. In the embodiment, where sacrificial material 240 is an oxide (e.g., $SiO_2$) and barrier material 230 is cubic boron nitride, sacrificial material 240 may be removed, by dipping structure 200 in hydrofluoric acid. Alternatively, an etchant introduced without a photolithographic mask overlying a portion of sacrificial material 240 to protect the material from an etch chemistry may be used. As shown in FIG. 6, following the removal of sacrificial material 240, conductive material 250, such as a copper material, remains exposed on substrate 210 of structure 200. In an embodiment where conductive material 250 is copper, the exposure of conductive material 250 by removal of sacrificial material 240 may be done in an inert or oxygen-free environment to prevent oxidation of the copper material.

Figure 7:
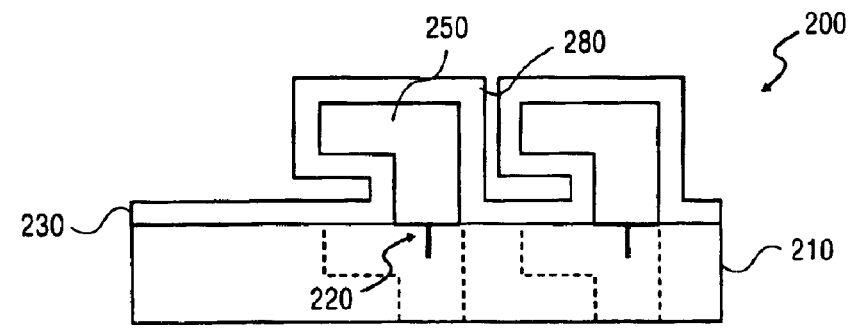
FIG. 7 shows the structure of FIG. 6 following the introduction of a barrier layer around the interconnection.

FIG. 7 shows the structure of FIG. 6 following the introduction of barrier layer 280. In one embodiment, barrier layer 280 is selected of a material having a dielectric constant less than 5. One suitable material is cubic boron nitride. In this case, both barrier layer 230 and barrier layer 280 are cubic boron nitride. As shown in FIG. 7, barrier layer 280 completely surrounds conductive material 250.

In one embodiment, there may be many conductive structures such as conductive material 250 formed to various contact points on substrate 210. A representative pitch between such structures (reference number 255 in FIG. 6) may be on the order of about 70 nanometers according to current technologies for interconnection lines. Accordingly, the thickness of barrier layer 280 is selected, in one embodiment, to be sufficient to surround conductive material 250 but thin enough to leave an area between conductive material structures exposed so as, for example, not to create voids between the structures. Where a pitch between conductive structures is on the order of about 70 nanometers, a thickness of barrier layer 280 may representatively be on the order of 30 to 40 nanometers.

Figure 8:
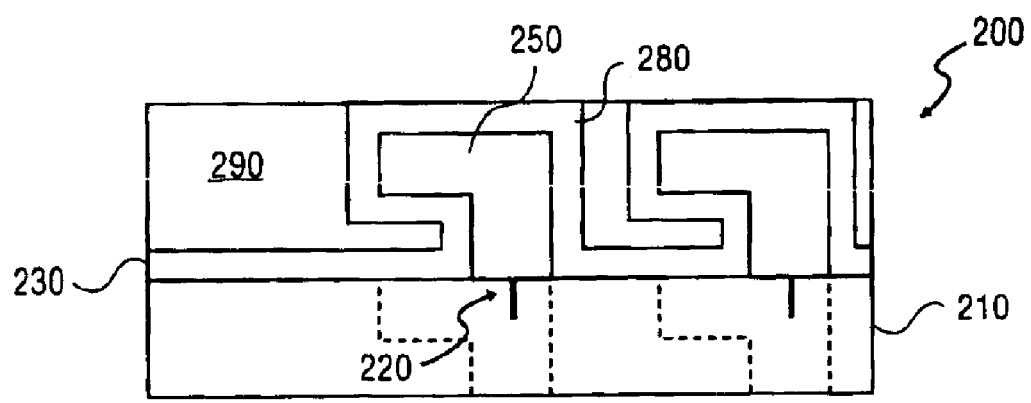
FIG. 8 shows the structure of FIG. 7 following the introduction of a dielectric layer on the substrate.

FIG. 8 shows the structure of FIG. 7 following the introduction of dielectric layer 290. In one embodiment, dielectric layer 290 is introduced as a blanket layer over a portion, including the entire portion of the structure. Dielectric layer 290, in one embodiment, is selected to have a low dielectric constant, preferably a dielectric constant less than two (2). In one embodiment, dielectric layer 290 is an aerogel (XLK). Aerogel is described as a porous glass and can have a dielectric constant on the order of 1.1. Although aerogel has a low dielectric constant, it is known to have inferior mechanical properties, being weak and brittle.

In one embodiment, dielectric layer 290 of aerogel may be introduced as a liquid, possibly through the use of a solvent. The material may then be dried (supercritical drying) to evaporate the solvent and form a solid dielectric material layer. Planarization may also be necessary to expose barrier layer 280 over conductive material 250 or to expose conductive material 250. In one embodiment, dielectric layer 290 of, for example, aerogel, and barrier layer 280 act as the substrate surface for additional layers. Collectively, barrier layer 230, barrier layer 280, and dielectric layer 290 define a composite dielectric layer (e.g., PMD or ILD layer) having a composite or an effective dielectric constant ($k_{eff}$). In one embodiment, the contribution of the material selected for barrier layer 280 and the material selected for barrier layer 280 is less than 20 percent, in another embodiment less than 10 percent, of the $k_{eff}$.

Figure 9:
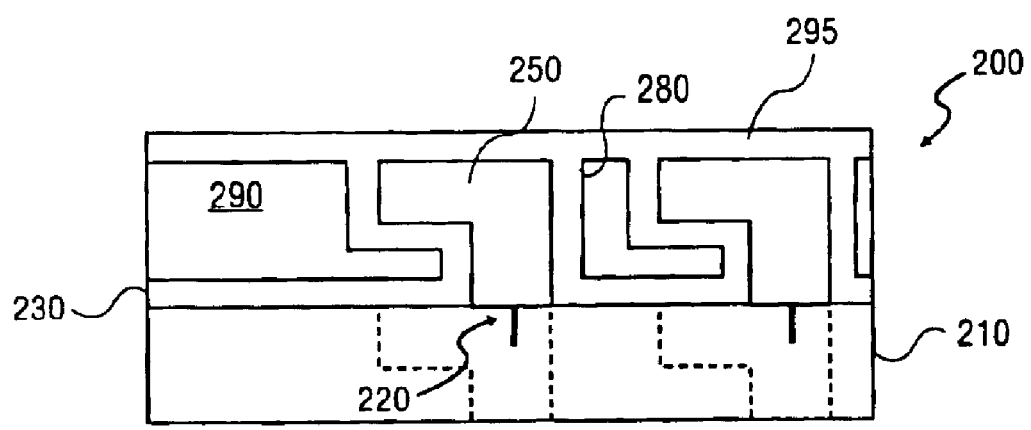
FIG. 9 shows the structure of FIG. 8 following the introduction of a barrier layer on the substrate.

FIG. 9 shows the structure of FIG. 8 following the introduction of barrier layer 295 as, for example, a blanket over a portion, including the entire portion, the substrate surface. In one embodiment, barrier layer 295 is similar to barrier layer 230 in that it has a dielectric constant less than about 5 and acts as a suitable diffusion barrier for a conductive structure for which it may be in contact. It also may have relatively good etch selectivity relative to a dielectric material that, together with barrier layer 295, forms an ILD. In one embodiment, barrier layer 295 is cubic boron nitride as is barrier layer 280 and barrier layer 230. In this manner, dielectric 290 of, for example, aerogel is encapsulated by cubic boron nitride.

In the preceding detailed description, specific embodiments are described. It will, however, be evident that various modifications and changes may be made thereto without departing from the broader spirit and scope of the claims. The specification and drawings are, accordingly, to be regarded in an illustrative rather than a restrictive sense.

What is claimed is:

1. An apparatus comprising:
   a contact point formed on a device layer of a circuit substrate or interconnect layer on the substrate;
   a first dielectric layer comprising cubic boron nitride on the substrate;
   a different second dielectric layer on the substrate and separated from the device layer by the first dielectric layer; and
   an interlayer contact having a length dimension extending through the first dielectric layer and the second dielectric layer to the contact point.

2. The apparatus of claim 1, wherein collectively the first dielectric layer and the second dielectric layer comprise a composite dielectric layer having a composite dielectric constant value less than 3.0.

3. The apparatus of claim 2, wherein a contribution of the first dielectric layer to the composite dielectric constant value is up to 20 percent.

4. The apparatus of claim 1, further comprising a third dielectric layer on the substrate such that the second dielectric layer is between the first dielectric layer and the third dielectric layer and collectively the layers define a composite dielectric layer, wherein the third dielectric layer comprises a material having a dielectric constant similar to the material of the first dielectric layer.

5. The apparatus of claim 4, wherein the length of the contact extends through the composite dielectric layer.

6. The apparatus of claim 5, wherein the third dielectric material is formed on the length dimension of the body between the contact and the second dielectric layer.

7. The apparatus of claim 6, wherein the material of the third dielectric layer comprises cubic boron nitride.

8. An apparatus comprising:
   a circuit substrate comprising a device layer; and
   a composite dielectric layer formed on the circuit substrate comprising:
      a first dielectric material comprising cubic boron nitride, and
      a different second dielectric material,
      wherein the first dielectric material surrounds the second dielectric material.

9. The apparatus of claim 8, wherein the composite dielectric has a dielectric constant value less than 3.0.

10. The apparatus of claim 9, wherein the contribution of a first dielectric layer to the composite dielectric constant value is up to 20 percent.

* * * * *